US009449884B1

(12) United States Patent
Seo

(10) Patent No.: US 9,449,884 B1
(45) Date of Patent: Sep. 20, 2016

(54) SEMICONDUCTOR DEVICE WITH TRENCH EPITAXY AND CONTACT

(71) Applicant: INTERNATIONAL BUSINESS MACHINES CORPORATION, Armonk, NY (US)

(72) Inventor: Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/968,960

(22) Filed: Dec. 15, 2015

(51) Int. Cl.
*H01L 21/8238* (2006.01)
*H01L 27/092* (2006.01)
*H01L 29/06* (2006.01)
*H01L 29/08* (2006.01)
*H01L 29/16* (2006.01)
*H01L 29/161* (2006.01)
*H01L 29/165* (2006.01)
*H01L 29/66* (2006.01)
*H01L 29/78* (2006.01)

(52) U.S. Cl.
CPC ............ *H01L 21/823814* (2013.01); *H01L 21/823821* (2013.01); *H01L 21/823878* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/66636* (2013.01); *H01L 29/7848* (2013.01)

(58) Field of Classification Search
CPC .............................................. H01L 21/823821
See application file for complete search history.

(56) References Cited

U.S. PATENT DOCUMENTS

| | | | |
|---|---|---|---|
| 7,405,154 B2 | 7/2008 | Cabral et al. | |
| 7,566,651 B2 | 7/2009 | Wong et al. | |
| 7,749,890 B2 | 7/2010 | Wong et al. | |
| 8,101,518 B2 | 1/2012 | Cabral et al. | |
| 8,450,204 B2 | 5/2013 | Yang et al. | |
| 8,785,320 B2 | 7/2014 | Yang et al. | |
| 2013/0309846 A1* | 11/2013 | Pham ................... | H01L 21/0245 438/478 |
| 2014/0001520 A1* | 1/2014 | Glass ................. | H01L 29/66439 257/288 |
| 2014/0312427 A1* | 10/2014 | Maeda ................ | H01L 27/0924 257/369 |
| 2014/0374827 A1* | 12/2014 | Suh ....................... | H01L 29/785 257/347 |
| 2015/0179789 A1 | 6/2015 | Kerber et al. | |
| 2015/0270222 A1 | 9/2015 | Alptekin et al. | |
| 2015/0279995 A1* | 10/2015 | Maeda ................ | H01L 29/7848 257/192 |
| 2015/0380405 A1* | 12/2015 | Seo ...................... | H01L 27/0886 257/401 |

* cited by examiner

*Primary Examiner* — Lex Malsawma
(74) *Attorney, Agent, or Firm* — Cantor Colburn LLP; Bryan Bortnick

(57) ABSTRACT

A semiconductor device comprises a semiconductor fin arranged on a substrate, a gate stack arranged over a channel region of the fin, a spacer arranged in contact with sidewalls of the gate stack, a trench partially defined by the spacer, the fin, and a flowable oxide material, an epitaxially grown source/drain region formed on the fin in the trench, and a contact metal arranged on the source/drain region in the trench, the contact metal substantially filling the trench.

19 Claims, 12 Drawing Sheets

2

SEMICONDUCTOR DEVICE WITH TRENCH EPITAXY AND CONTACT

BACKGROUND

The present invention generally relates to metal oxide semiconductor field effect transistor (MOSFET) devices, and more specifically, to MOSFET devices with an epitaxially grown source/drain region.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (nFET) and p-type field effect transistors (nFET) are two types of complementary MOSFETs. The nFET uses electrons as the current carriers and with n-doped source and drain junctions. The pFET uses holes as the current carriers and with p-doped source and drain junctions.

As the scale of MOSFET devices continues to decrease, fabricating effective devices becomes more challenging.

SUMMARY

According to an embodiment of the present invention, a method for fabricating a semiconductor device comprises forming a semiconductor fin on a substrate, forming a first gate stack over a first channel region of the fin and forming a second gate stack over a second channel region of the fin, forming a spacers adjacent to the first gate stack and the second gate stack, depositing a first liner layer on the spacers, the first gate stack, and the second gate stack, depositing a semiconductor material on the first liner layer, etching to remove a portion of the semiconductor material to form a first cavity arranged between the first gate stack and the second gate stack, depositing an insulator material in the first cavity, depositing a first cap layer over the insulator material, the semiconductor material, the first gate stack and the second gate stack, etching to remove exposed portions of the first cap layer, the semiconductor material adjacent to the first gate stack to form a second cavity that exposes portions of the fin, epitaxially growing a first source/drain region on exposed portions of the fin in the second cavity, depositing a conductive material in the second cavity, and depositing a second cap layer over portions of the insulator layer, the conductive material in the second cavity, the first gate stack and the first cap layer.

According to another embodiment of the present invention, a method for fabricating a semiconductor device comprises forming a semiconductor fin on a substrate, forming a first gate stack over a first channel region of the fin and forming a second gate stack over a second channel region of the fin, forming a spacers adjacent to the first gate stack and the second gate stack, depositing a first liner layer on the spacers, the first gate stack, and the second gate stack, depositing a semiconductor material on the first liner layer, etching to remove a portion of the semiconductor material to form a first cavity arranged between the first gate stack and the second gate stack, depositing an insulator material in the first cavity, depositing a first cap layer over the insulator material, the semiconductor material, the first gate stack and the second gate stack, etching to remove exposed portions of the first cap layer, the semiconductor material adjacent to the first gate stack and portions of the fin to form a second cavity that exposes portions of the fin, epitaxially growing a first source/drain region on exposed portions of the fin in the second cavity, depositing a conductive material in the second cavity, and depositing a second cap layer over portions of the insulator layer, the conductive material in the second cavity, the first gate stack and the first cap layer.

According to yet another embodiment of the present invention, a semiconductor device comprises a semiconductor fin arranged on a substrate, a gate stack arranged over a channel region of the fin, a spacer arranged in contact with sidewalls of the gate stack, a trench partially defined by the spacer, the fin, and a flowable oxide material, an epitaxially grown source/drain region formed on the fin in the trench, and a contact metal arranged on the source/drain region in the trench, the contact metal substantially filling the trench.

BRIEF DESCRIPTION OF THE DRAWINGS

FIG. 1 illustrates a top view of semiconductor fins that are arranged on an insulator layer of a substrate.

FIG. 2 illustrates a cutaway view along the line A-A of FIG. 1 of the substrate and the fins.

FIG. 3 illustrates a cutaway view along the line B-B showing the substrate, the fin, the sacrificial gate stacks and a hardmask.

FIG. 4 illustrates a cutaway view following the deposition of a layer of spacer material over exposed portions of the substrate, the fin, and the sacrificial gate stacks.

FIG. 5 illustrates a cutaway view following an anisotropic etching process.

FIG. 6 illustrates a cutaway view following the deposition of a layer of oxide material.

FIG. 7 illustrates a cutaway view following the deposition of a layer of amorphous silicon or polysilicon material.

FIG. 8 illustrates a cutaway view following the patterning of a mask.

FIG. 9 illustrates a cutaway view of the resultant structure following the deposition of an insulator material.

FIG. 10 illustrates a cutaway view following the formation of a first cap layer.

FIG. 11 illustrates a cutaway view following the patterning of a mask over the nFET region of the first cap layer.

FIG. 12 illustrates a cutaway view following a selective anisotropic etching process.

FIG. 13 illustrates a cutaway view of the resultant structure following the formation of epitaxially grown source/drain regions.

FIG. 14 illustrates a cutaway view of the resultant structure following the formation of a silicide region.

FIG. 15 illustrates a cutaway view following the deposition of a second cap layer.

FIG. 16 illustrates a cutaway view following the formation of a mask on the second cap layer.

FIG. 17 illustrates a cutaway view of the resultant structure following a selective anisotropic etching process.

FIG. 18 illustrates a cutaway view of the resultant structure following the formation of epitaxially grown source/drain regions.

FIG. 19 illustrates a cutaway view of the resultant structure following the formation of a silicide region.

FIG. 20 illustrates the formation of cavities in the pFET region.

FIG. 21 illustrates a cutaway view following the formation of epitaxially grown source/drain regions.

FIG. 22 illustrates the formation of cavities in the nFET region.

FIG. 23 illustrates a cutaway view following the formation of epitaxially grown source/drain regions.

DETAILED DESCRIPTION

Previous methods and processes for fabricating MOSFET devices have presented a number of challenges as the scale of the devices is reduced.

In this regard, in MOSFET devices, a spacer is often formed adjacent to the gate stacks of the devices. Since the nFET and pFET devices are formed using different materials, the thickness of the spacers may be different when using previous fabrication processes. As performance tolerances become higher, the difference in the spacer thickness results in an undesirable offset in the location of the contacts that contact the source/drain regions of the devices. In previous processes, the contacts were formed using a lithographic patterning and etching process. The previous processes have become increasingly more difficult to align properly while achieving a desired contact arrangement that does not degrade the performance of the devices. The source/drain regions are often formed from epitaxially grown semiconductor material. The growth of the source/drain regions in previous fabrication processes could result in an undesirable short between source/drain regions.

Figure 1:
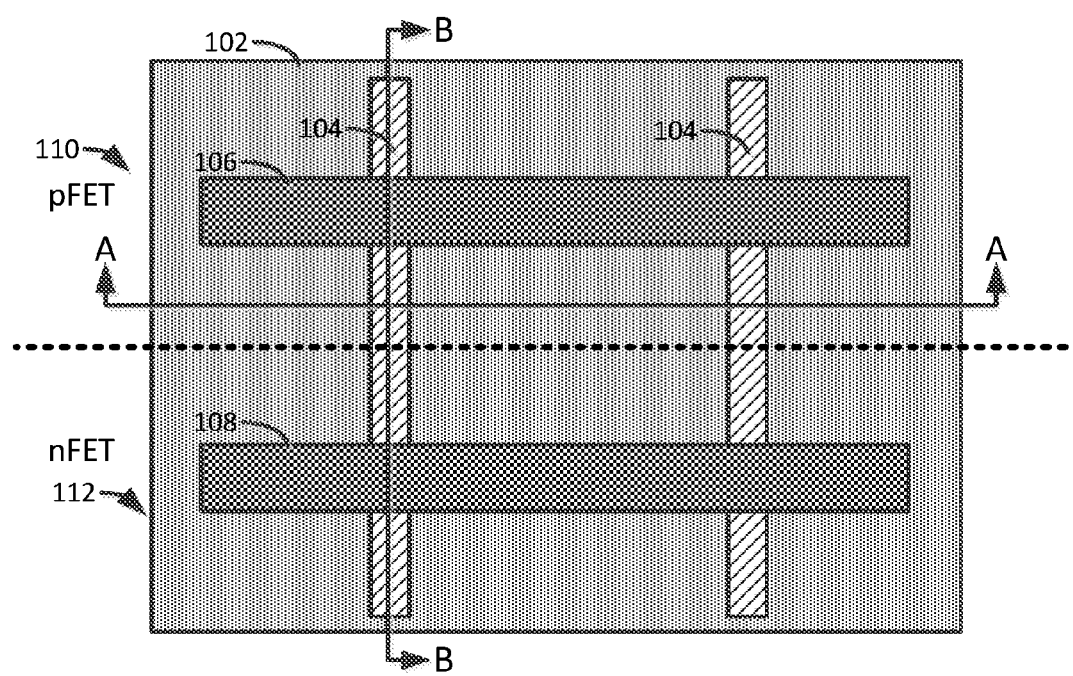
FIGS. 1-19 provide an exemplary method and resultant semiconductor device.

FIGS. 1-19 provide an exemplary method and resultant semiconductor device that substantially addresses some of the challenges described above. FIG. 1 illustrates a top view of semiconductor fins 104 that are arranged on an insulator layer of a substrate 102. Though the illustrated embodiment shows a silicon-on-insulator (SOI) substrate with a buried oxide (BOX) layers, alternate embodiments may include a bulk semiconductor substrate. Non-limiting examples of suitable substrate materials include.

The fins 104 are formed from a suitable semiconductor material such as, for example, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. The fins 104 are formed in a pFET region 110 and an nFET region 112 of the substrate 102. The fins 104 may be formed by, for example, a lithographic patterning and etching process such as reactive ion etching, or another suitable fabrication process such as sidewall image transfer.

Sacrificial gate stacks 106 and 108 are arranged on the substrate 102 and over channel regions of the fins 104. The sacrificial gate stacks 106 and 108 may be formed by, for example, depositing a layer of amorphous silicon or polysilicon over the substrate 102 and the fins 104 and 108. A hardmask layer 302 (of FIG. 3) may be deposited over the silicon layer. A lithographic patterning and etching process such as, for example, reactive ion etching may be performed to form the sacrificial gate stacks 106 and 108 over channel regions of the fins 104 and 106.

Figure 2:
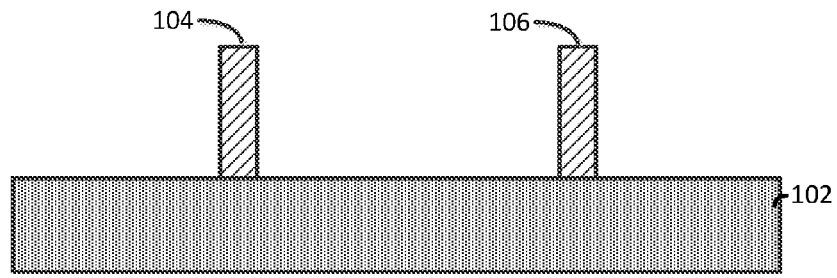

FIG. 2 illustrates a cutaway view along the line A-A of FIG. 1 of the substrate 102 and the fins 104 and 106.

Figure 3:
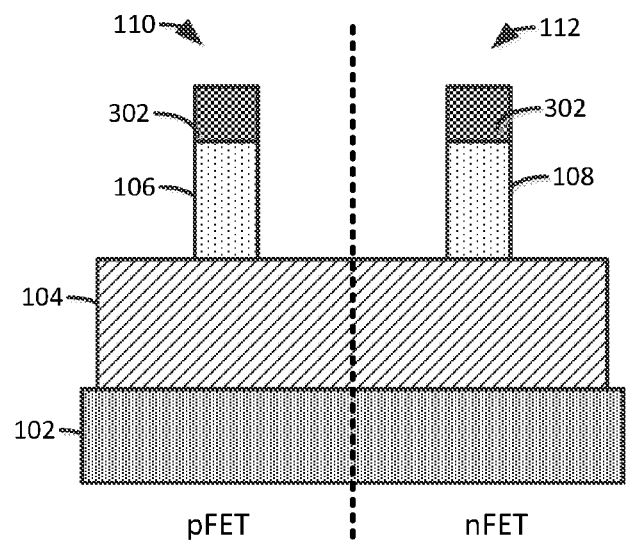

FIG. 3 illustrates a cutaway view along the line B-B showing the substrate 102, the fin 104, the sacrificial gate stacks 106 and a hardmask 302. Non-limiting examples of suitable materials for the hard mask 302 include silicon oxide, silicon nitride, or any combination thereof.

The embodiments described below show a replacement metal gate (gate last) process flow however, in an alternate embodiment, similar methods described herein may be used in a gate first process flow, where as opposed to forming the sacrificial gate stacks 106 and 108, a metal gate is formed. Following the formation of the metal gate, the process flow of the alternate embodiment is similar to those described below.

Figure 4:
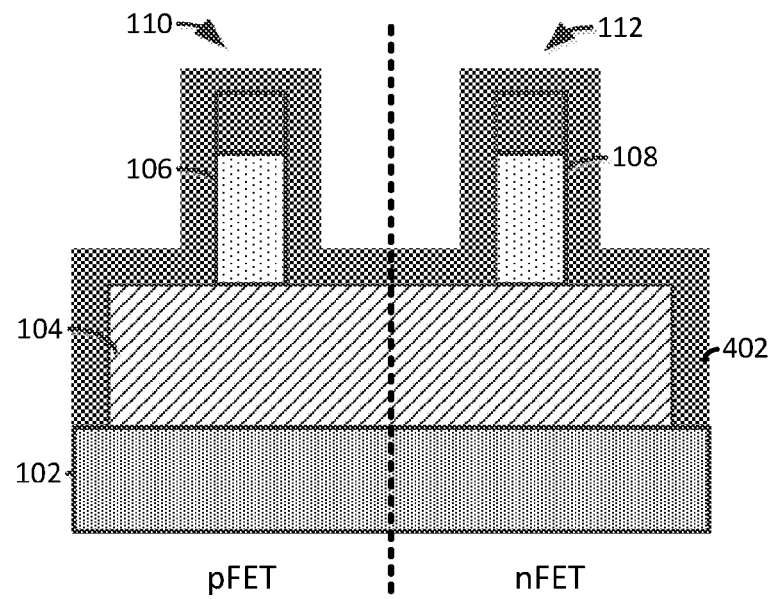

FIG. 4 illustrates a cutaway view following the deposition of a layer of spacer material 402 over exposed portions of the substrate 102, the fin 104, and the sacrificial gate stacks 106 and 108. The layer of spacer material 402 may contain a nitride or low-K material such as Si, N, B, and C that has a dielectric constant lower than six. For example, the spacer material 402 may include SiOCN, SiBN, SiCN, SiBCN, or any combination thereof.

Figure 5:
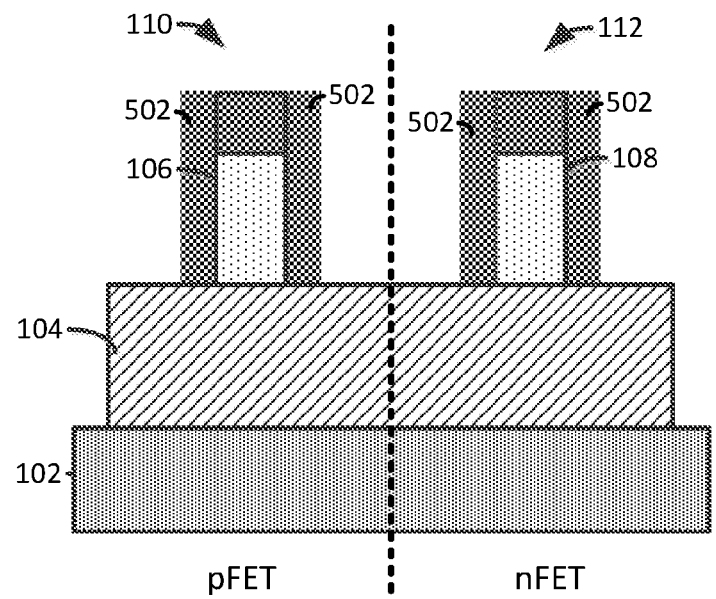

FIG. 5 illustrates a cutaway view following an anisotropic etching process, such as, for example, reactive ion etching that removes portions of the layer of spacer material 402 (of FIG. 4) to form spacers 502 adjacent to the sacrificial gate stacks 106 and 108.

Figure 6:
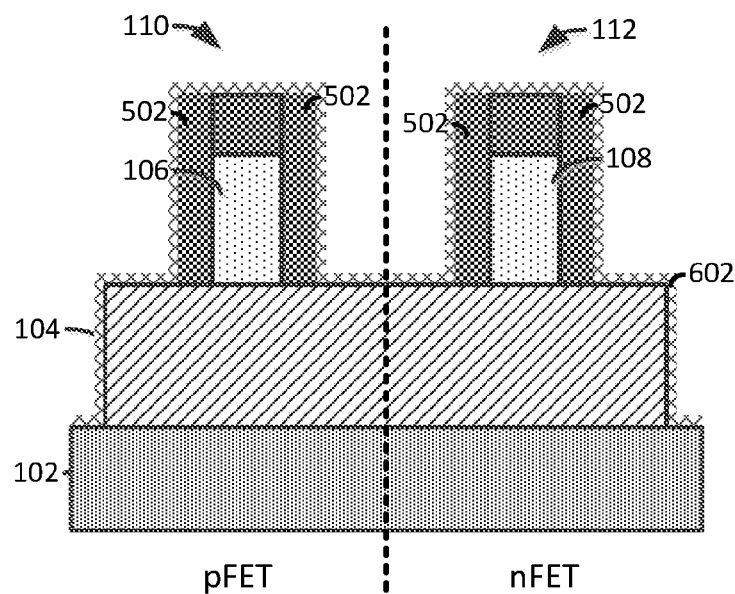

FIG. 6 illustrates a cutaway view following the deposition of a layer of oxide material 602 over exposed portions of the substrate 102, the fins 104, the spacers 502, and the sacrificial gate stacks 106. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 7:
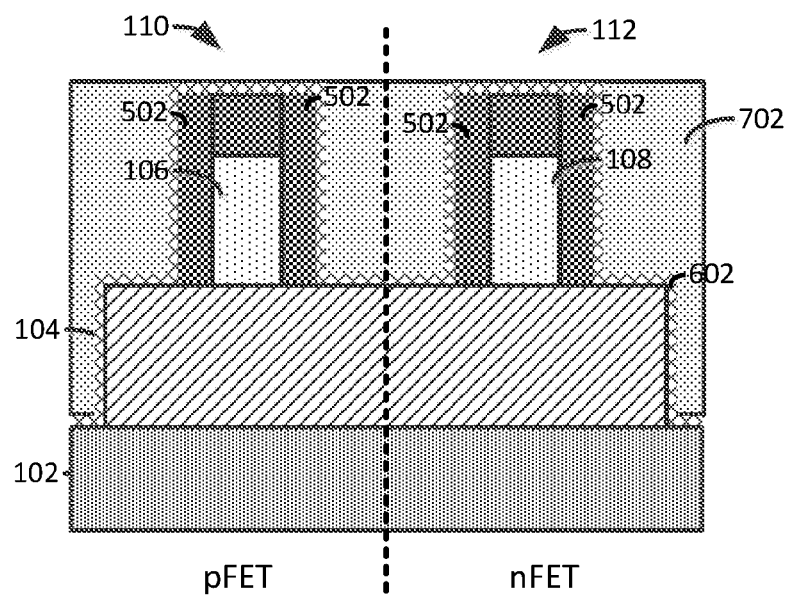

FIG. 7 illustrates a cutaway view following the deposition of a layer of amorphous silicon or polysilicon material 702. The material 702 may be deposited by any suitable deposition process such as, for example, chemical vapor deposition. Following the deposition of the material 702, a planarization process such as, for example, chemical mechanical polishing is performed.

Figure 8:
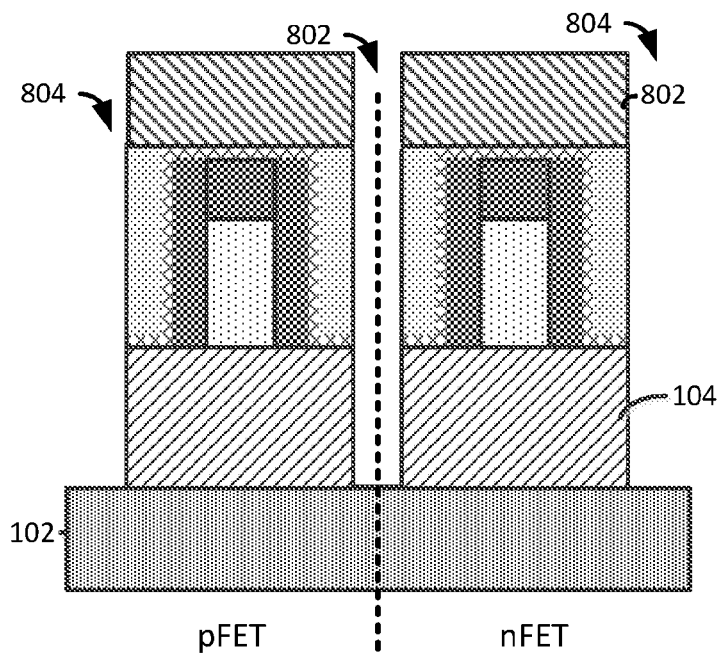

FIG. 8 illustrates a cutaway view following the patterning of a source/drain active fin mask 802 over portions of the material 702 and the sacrificial gate stacks 106 and 108. Suitable masks 802 include photoresists, electron-beam resists, ion-beam resists, X-ray resists, and etch resists. The mask 802 may a polymeric spin on material or a polymeric material.

Following the patterning of the mask 802 an anisotropic etching process such as, for example, reactive ion etching is performed to remove exposed portions of the material 702 and the fin 104 to form cavities 804 that expose portions of the substrate 102. Following the etching process, the mask 802 may be removed by, for example, an ashing process.

Figure 9:
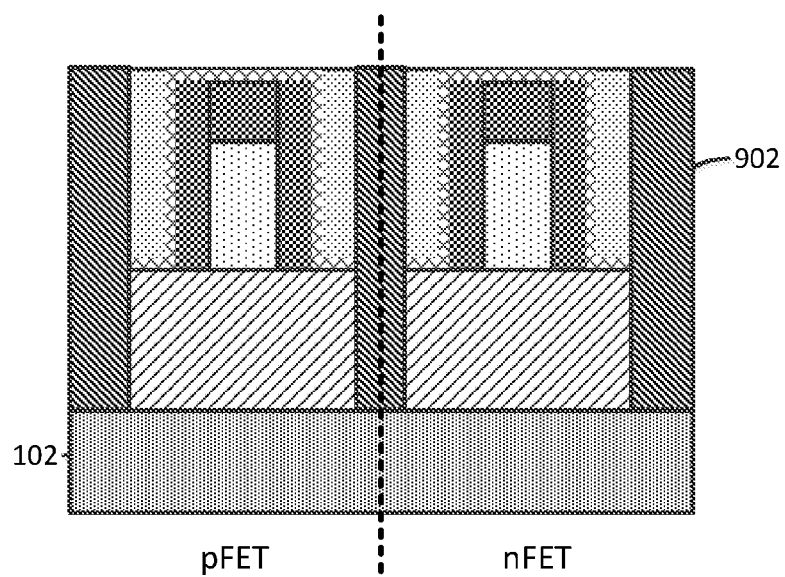

FIG. 9 illustrates a cutaway view of the resultant structure following the deposition of an insulator material 902, such as, for example a flowable oxide material that fills the cavities 802 (of FIG. 8). Following the deposition of the insulator material 902, a planarization process such as, for example, chemical mechanical polishing may be performed.

Figure 10:
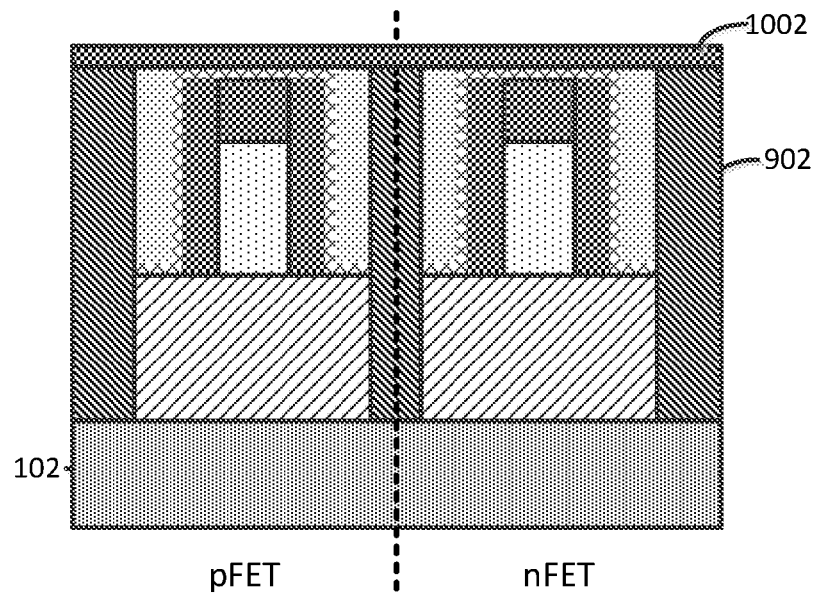

FIG. 10 illustrates a cutaway view following the formation of a first cap layer 1002 over the insulator material 902, the spacers 502, and the sacrificial gate stacks 106 and 108. The first cap layer 1002 may contain, for example, a suitable nitride or oxide material.

Figure 11:
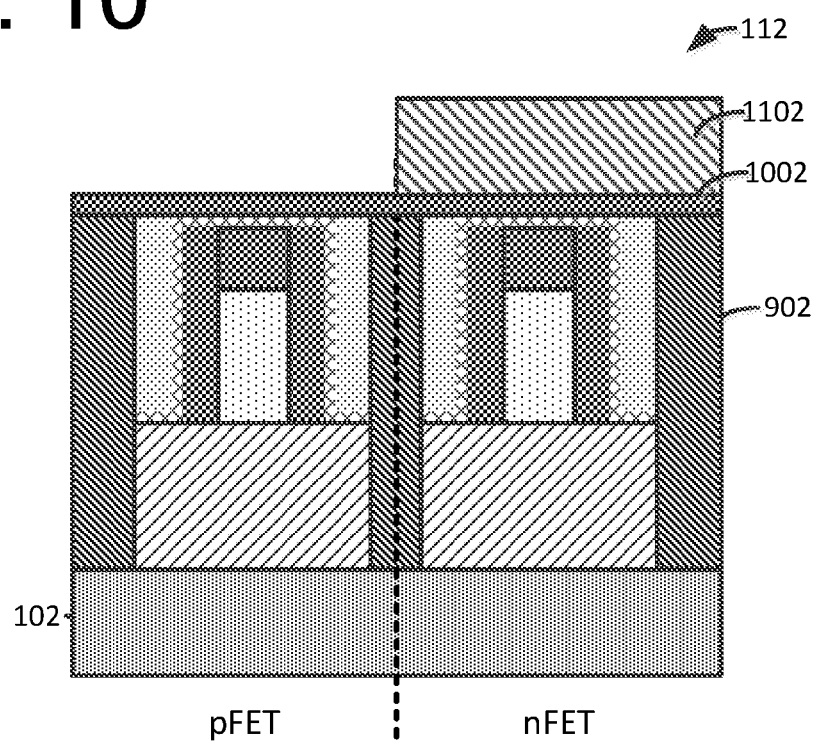

FIG. 11 illustrates a cutaway view following the patterning of a mask 1102 over the nFET region of the first cap layer 1002. Suitable masks 1102 include photoresists, electron-beam resists, ion-beam resists, X-ray resists, and etch resists. The mask 1102 may a polymeric spin on material or a polymeric material.

Figure 12:
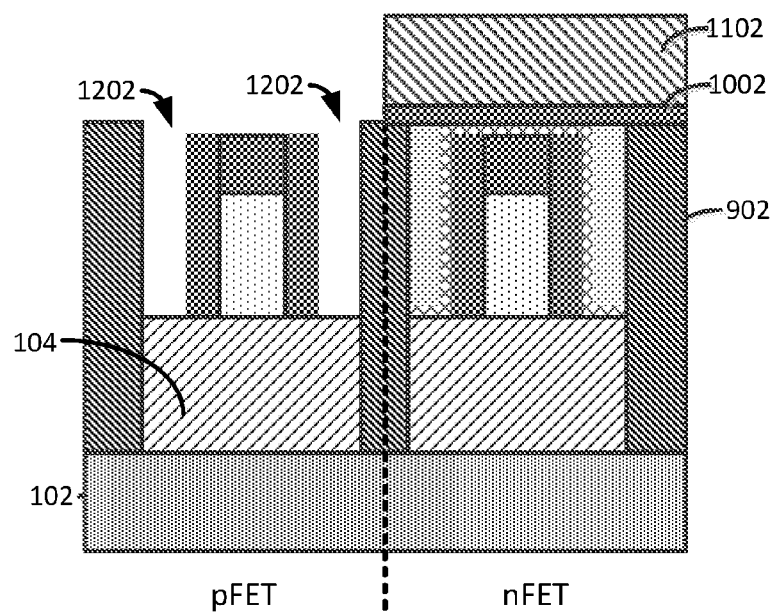

FIG. 12 illustrates a cutaway view following a selective anisotropic etching process that may include, for example, reactive ion etching that removes exposed portions of the first cap layer 1002 and the insulator material 702 and forms a cavity 1202 that exposes the fin 104. In an alternate exemplary embodiment portions of the fin 104 may also be removed, which increases the depth of the cavity 1202. The alternate exemplary embodiment will be described in further detail below. Following the formation of the cavities 1202, the mask 1102 may be removed by, for example, an ashing process.

Figure 13:
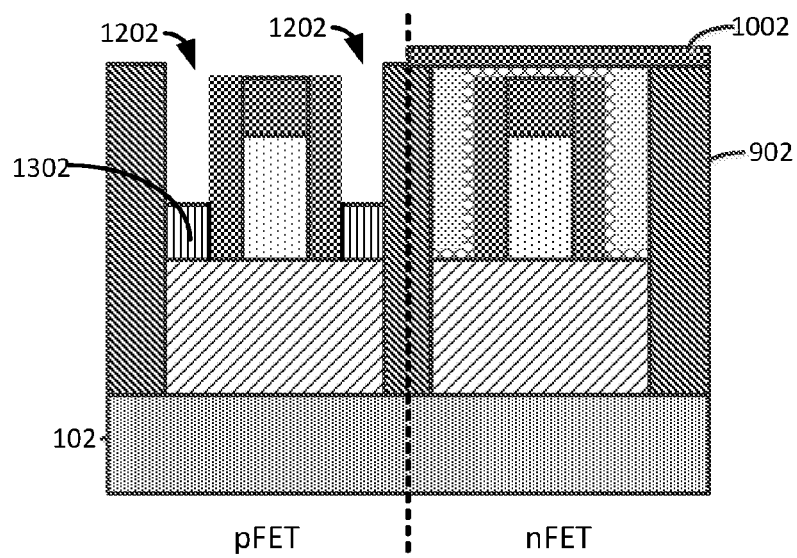

FIG. 13 illustrates a cutaway view of the resultant structure following the formation of epitaxially grown source/drain regions 1302 in the cavities 1202. In this regard, an epitaxial growth process is performed to deposit a crystalline layer onto a crystalline substrate beneath. The underlying substrate (the fin 104) acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device. In some embodiments, the source/drain region may be doped using an ion implantation process.

The cavities 1202 are operative to align the source/drain regions 1302 such that the epitaxially grown material is formed in the cavities 1202, and is restricted from growing outside of the cavities 1202, which could cause undesirable shorting between adjacent source/drain regions.

Figure 14:
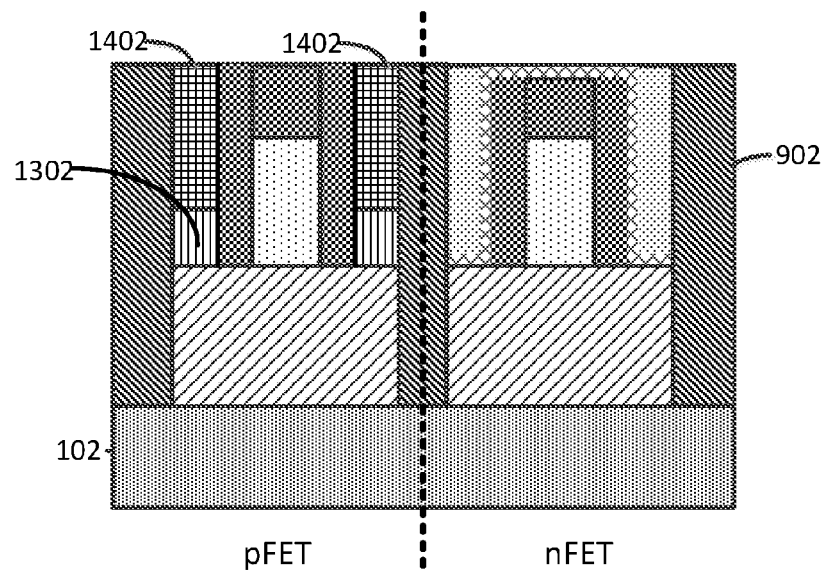

FIG. 14 illustrates a cutaway view of the resultant structure following the formation of a silicide region (not shown) on exposed portions of the source/drain regions 1302. A silicide may be formed by, for example, depositing a conductive metal on exposed surfaces of the source/drain regions 1302 and performing an annealing process that forms a layer of silicide on the source/drain regions 1302. A pFET type metal may be deposited in the cavities 1202 (of FIG. 13) such as, for example, Ir or Pt, which lowers the schottky barrier in some embodiments. A barrier layer such as, for example, Ta, Ru, or Ti may be formed in the cavities 1202 followed by the deposition of a contact metal such as, for example, W, Cu or Co. A planarization process such as, for example, chemical mechanical polishing may be performed to define the contacts 1402.

Figure 15:
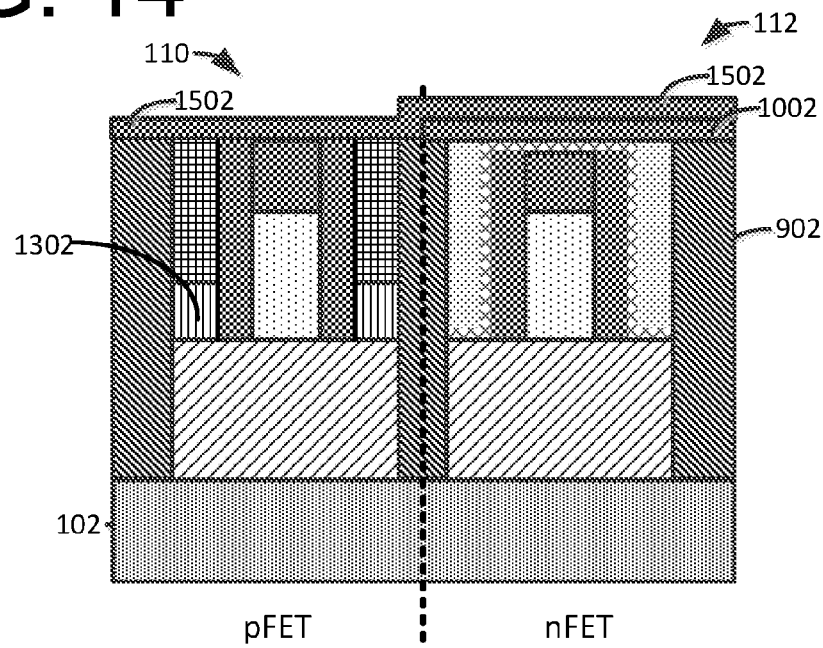

FIG. 15 illustrates a cutaway view following the deposition of a second cap layer 1502 over the pFET region 110 and the first capping layer 1002 in the nFET region 112. The second cap layer 1502 may contain, for example, a suitable nitride or oxide material.

Figure 16:
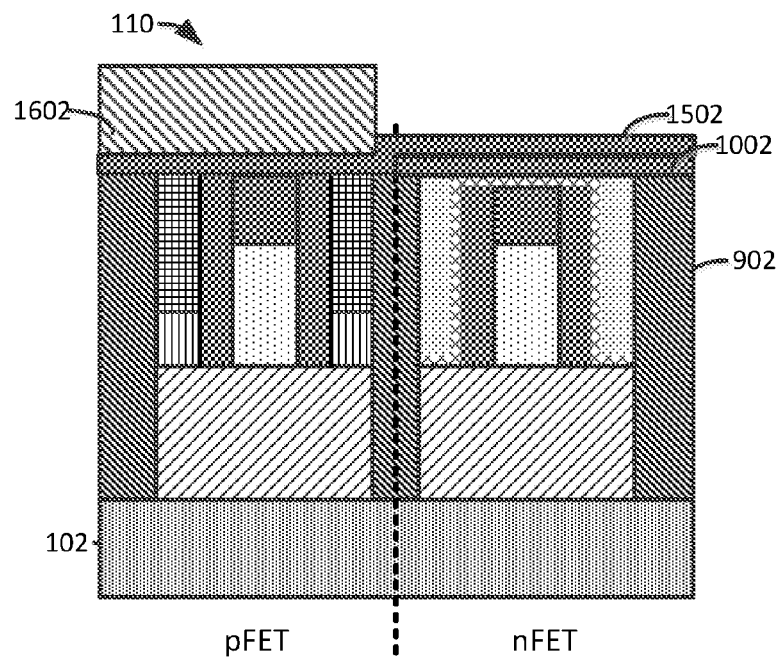

FIG. 16 illustrates a cutaway view following the formation of a mask 1602 on the second cap layer 1502 over the pFET region 110. The mask 1602 may be patterned and formed using any suitable lithographic patterning process.

Figure 17:
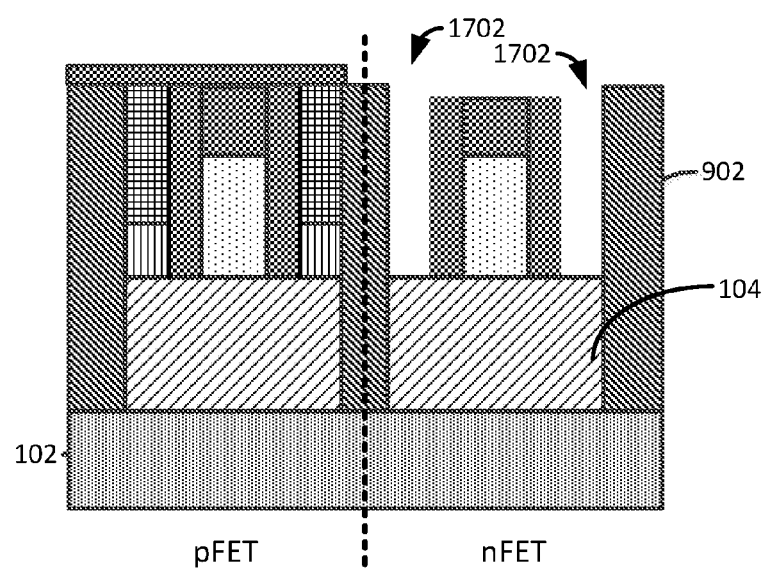

FIG. 17 illustrates a cutaway view of the resultant structure following a selective anisotropic etching process that may include, for example, reactive ion etching that removes exposed portions of the second cap layer 1502, the first cap layer 1002 (of FIG. 16) and the insulator material 702 and forms a cavity 1702 that exposes the fin 104. In an alternate exemplary embodiment portions of the fin 104 may also be removed, which increases the depth of the cavity 1702. The alternate exemplary embodiment will be described in further detail below. Following the formation of the cavities 1702, the mask 1602 (of FIG. 16) may be removed by, for example, an ashing process.

Figure 18:
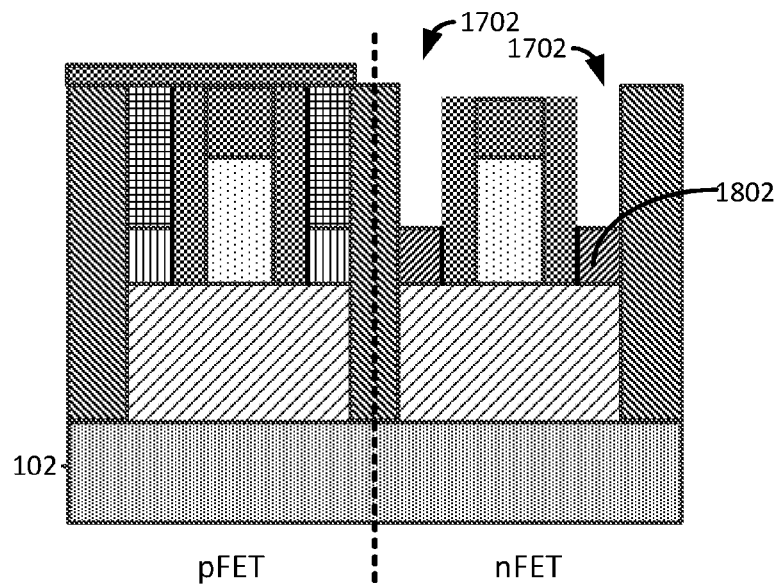

FIG. 18 illustrates a cutaway view of the resultant structure following the formation of epitaxially grown source/drain regions 1802 in the cavities 1702. In this regard, an epitaxial growth process is performed to deposit a crystalline layer onto a crystalline substrate beneath. The underlying substrate (the fin 104) acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device. In some embodiments, the source/drain region may be doped using an ion implantation process.

The cavities 1702 are operative to align the source/drain regions 1802 such that the epitaxially grown material is formed in the cavities 1702, and is restricted from growing outside of the cavities 1802, which could cause undesirable shorting between adjacent source/drain regions.

Figure 19:
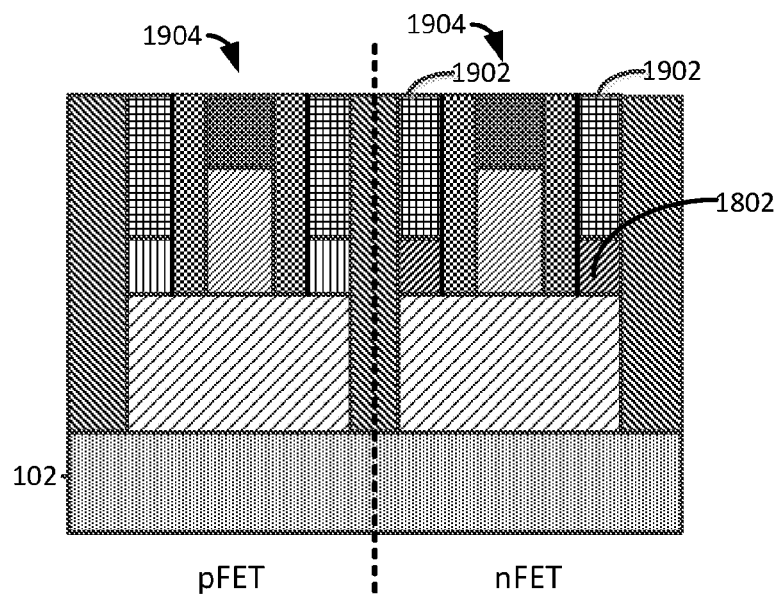

FIG. 19 illustrates a cutaway view of the resultant structure following the formation of a silicide region (not shown) on exposed portions of the source/drain regions 1802. A silicide may be formed by, for example, depositing a conductive metal on exposed surfaces of the source/drain regions 1802 and performing an annealing process that forms a layer of silicide on the source/drain regions 1802. An nFET type metal may be deposited in the cavities 1702 (of FIG. 17) such as, for example, Sc, Y, Tb, Er, or Yb, which lowers the schottky barrier in some embodiments. A barrier layer such as, for example, Ta, Ru, or Ti may be formed in the cavities 1702 followed by the deposition of a contact metal such as, for example, W, Cu or Co. A planarization process such as, for example, chemical mechanical polishing may be performed to define the contacts 1902.

FIG. 19 shows an exemplary embodiment of metal gate stacks 1904 that are formed by, for example, removing the sacrificial gate stacks 106 and 108 to expose channel regions of the fins 104. Once the channel regions are exposed, replacement metal gate stacks are formed.

The gate stack includes high-k metal gates formed, for example, by filling a sacrificial gate stack opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the pFET 110 and the nFET 112. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Figure 20:
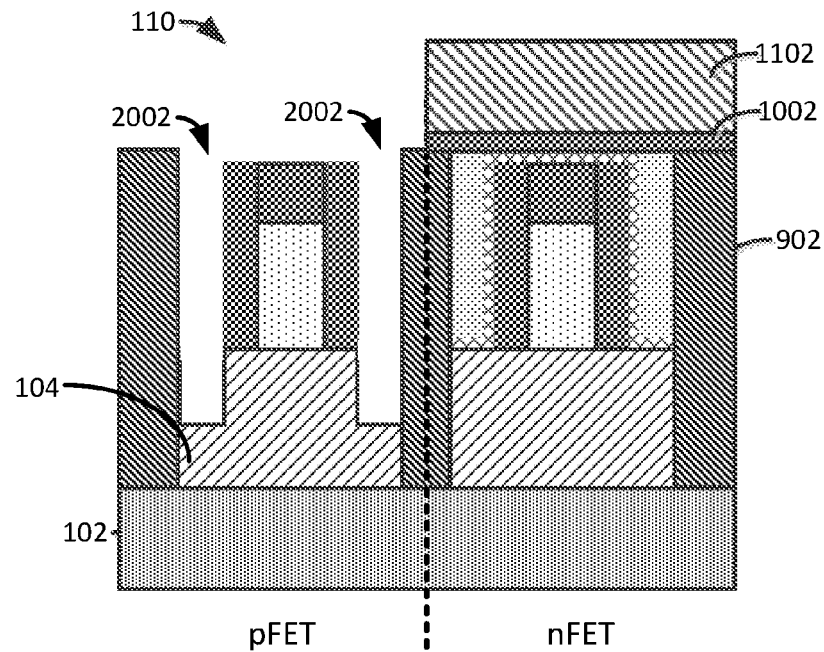
FIGS. 20 and 21 illustrate cutaway views of an alternate exemplary method.
Figure 21:
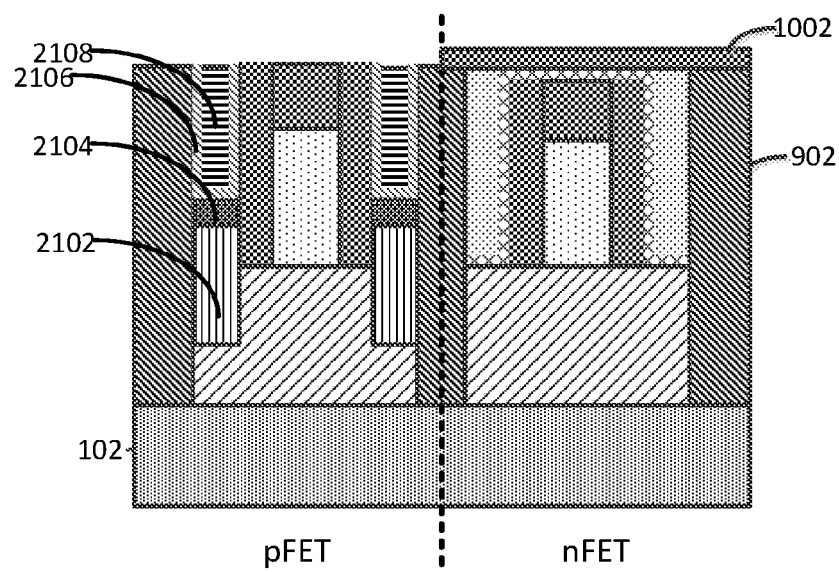

FIGS. 20 and 21 illustrate cutaway views of an alternate exemplary method. In this regard, FIG. 20 illustrates the formation of cavities 2002 in the pFET region 110 using a similar process as described above in FIG. 12 for forming the cavities 1202. The cavities 2002 are formed by removing exposed portions of the fin 104 following exposure of the fin 104 after the insulator material 702 is removed.

FIG. 21 illustrates a cutaway view following the formation of epitaxially grown source/drain regions 2102. The source/drain regions 2102 are formed using a similar process as shown and discussed above in FIG. 13. By removing a portion of the fin 104, a larger epitaxially grown source/drain region 2102 may be formed in the cavities 2002. Following the formation of the source/drain regions 2102, a silicide 2104 is formed on the source/drain regions 2102. An etch stop layer 2106 is deposited in the cavity 2002 (of FIG. 20) over the silicide 2104. The etch stop layer 2106 may include, for example, a TiN or TaN material. After the etch stop layer 2106 is formed, a MOL dielectric material 2108 is deposited over the etch stop layer 2106 in the cavity 2002.

Subsequent fabrication processes described above in FIGS. 15-19 may be performed to substantially complete the semiconductor device.

Figure 22:
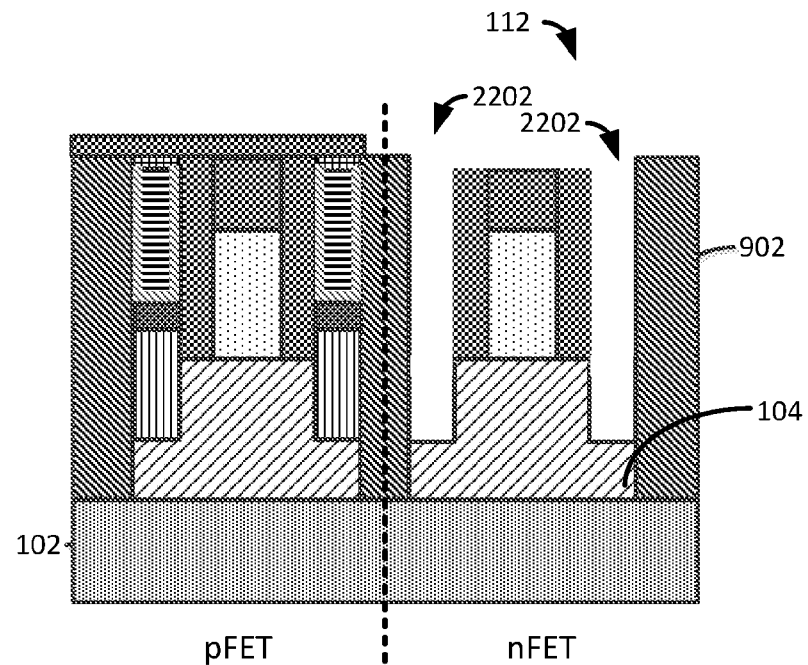
FIGS. 22 and 23 illustrate cutaway views of another alternate exemplary method.
Figure 23:
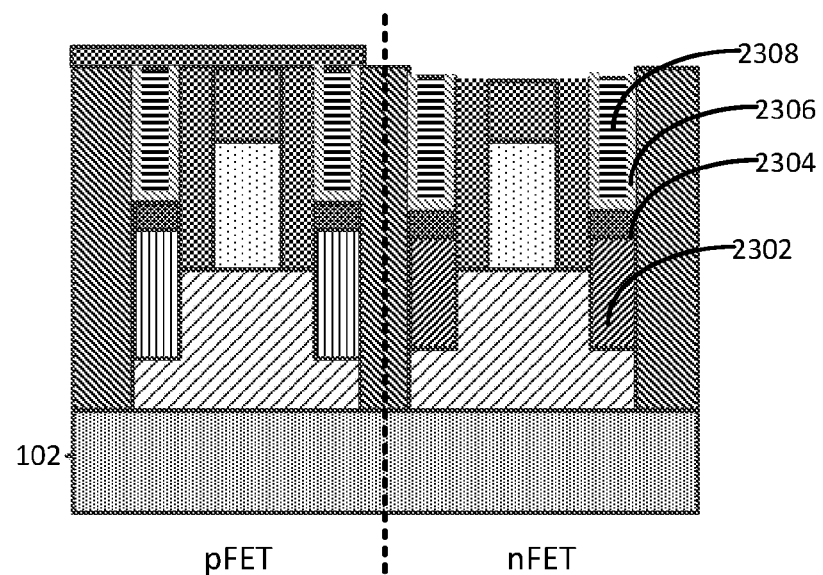

FIGS. 22 and 23 illustrate cutaway views of another alternate exemplary method, which may be combined with the methods described above in FIGS. 1-19 and/or FIGS. 20 and 21. In this regard, FIG. 22 illustrates the formation of cavities 2202 in the nFET region 112 using a similar process as described above in FIG. 17 for forming the cavities 1702. The cavities 2202 are formed by removing exposed portions of the fin 104 following exposure of the fin 104 after the insulator material 702 is removed.

FIG. 23 illustrates a cutaway view following the formation of epitaxially grown source/drain regions 2302. The source/drain regions 2302 are formed using a similar process as shown and discussed above in FIG. 19. By removing a portion of the fin 104, a larger epitaxially grown source/drain region 2302 may be formed in the cavities 2202. Following the formation of the source/drain regions 2302, a silicide 2304 is formed on the source/drain regions 2302. An etch stop layer 2306 is deposited in the cavity 2202 (of FIG. 22) over the silicide 2304. The etch stop layer 2306 may include, for example, a TiN or TaN material. After the etch stop layer 2306 is formed, a MOL dielectric material 2308 is deposited over the etch stop layer 2306 in the cavity 2202.

The epitaxially grown source/drain regions 1302 and 2102 may be formed from a dissimilar material than the epitaxially grown source/drain regions 1802 and 2302.

The methods and resultant devices described herein provide for a FET device having epitaxially grown source and drain regions that are formed in a cavity that restricts the growth of the source/drain regions in the cavity. This is operative to reduce the chances of forming undesirable shorts between source/drain regions. The contacts for the source/drain regions are formed in the cavity and are aligned by the cavity to the source/drain regions, which reduces potential misalignment between the source/drain regions and the contacts as well as improving the quality and performance of the contacts and the FET device.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
   forming a semiconductor fin on a substrate;
   forming a first gate stack over a first channel region of the fin;
   depositing a first liner layer on the first gate stack;
   depositing a semiconductor material on the first liner layer;
   etching to remove a portion of the semiconductor material to form a first cavity adjacent to the first gate stack;
   depositing an insulator material in the first cavity;
   depositing a first cap layer over the insulator material, the semiconductor material, and the first gate stack;
   etching to remove exposed portions of the first cap layer, the semiconductor material adjacent to the first gate stack to form a second cavity that exposes portions of the fin; and
   growing a first source/drain region on exposed portions of the fin in the second cavity.

2. The method of claim 1, further comprising forming a spacers adjacent to the first gate stack prior to depositing the first liner layer.

3. The method of claim 1, further comprising:
   forming a second gate stack over a second channel region of the fin when forming the first gate stack;
   depositing a first liner layer on the second gate stack when depositing the first liner layer on the first gate stack, wherein the first cavity is arranged between the first gate stack and the second gate stack; and
   depositing the first cap layer over the second gate stack.

4. The method of claim 1, further comprising:
   depositing a conductive material in the second cavity; and
   depositing a second cap layer over portions of the insulator layer, the conductive material in the second cavity, the first gate stack and the first cap layer.

5. The method of claim 4, further comprising:
   etching to remove exposed portions of the second cap layer, the first cap layer, the semiconductor material adjacent to the gate stack to form a third cavity that exposes portions of the fin;
   epitaxially growing a second source/drain region on exposed portions of the fin in the third cavity; and
   depositing a conductive material in the second cavity.

6. The method of claim 5, wherein the second source/drain region includes a second epitaxially grown semiconductor material including n-type dopants.

7. The method of claim 1, wherein the depositing a semiconductor material on the first liner layer includes depositing an amorphous semiconductor material.

8. The method of claim 1, wherein the insulator material includes a flowable oxide material.

9. The method of claim 1, further comprising forming a silicide material on exposed portions of the first source/drain region prior to depositing the conductive material in the second cavity.

10. The method of claim 1, wherein the first cap layer includes a nitride material.

11. The method of claim 1, wherein the etching to remove exposed portions of the first cap layer, the semiconductor material adjacent to the first gate stack to form a second cavity that exposes portions of the fin also includes removing exposed portions of the first liner layer.

12. The method of claim 1, wherein the etching to remove a portion of the semiconductor material to form a first cavity arranged between the first gate stack and the second gate stack includes removing an exposed portion of the fin.

13. A method for fabricating a semiconductor device, the method comprising:
   forming a semiconductor fin on a substrate;
   forming a first gate stack over a first channel region of the fin and forming a second gate stack over a second channel region of the fin;
   forming a spacers adjacent to the first gate stack and the second gate stack;
   depositing a first liner layer on the spacers, the first gate stack, and the second gate stack;
   depositing a semiconductor material on the first liner layer;
   etching to remove a portion of the semiconductor material to form a first cavity arranged between the first gate stack and the second gate stack;
   depositing an insulator material in the first cavity;
   depositing a first cap layer over the insulator material, the semiconductor material, the first gate stack and the second gate stack;
   etching to remove exposed portions of the first cap layer, the semiconductor material adjacent to the first gate stack and portions of the fin to form a second cavity that exposes portions of the fin;
   epitaxially growing a first source/drain region on exposed portions of the fin in the second cavity;
   depositing a conductive material in the second cavity; and
   depositing a second cap layer over portions of the insulator layer, the conductive material in the second cavity, the first gate stack and the first cap layer.

14. The method of claim 13, further comprising:
   etching to remove exposed portions of the second cap layer, the first cap layer, the semiconductor material adjacent to the second gate stack to form a third cavity that exposes portions of the fin;
   epitaxially growing a second source/drain region on exposed portions of the fin in the third cavity; and
   depositing a conductive material in the second cavity.

15. The method of claim 13, further comprising:
   etching to remove exposed portions of the second cap layer, the first cap layer, the semiconductor material adjacent to the second gate stack, and a portion of the fin to form a third cavity that exposes portions of the fin;

epitaxially growing a second source/drain region on exposed portions of the fin in the third cavity; and depositing a conductive material in the second cavity.

16. The method of claim 13, wherein the first liner layer includes an oxide material.

17. The method of claim 13, wherein the depositing a semiconductor material on the first liner layer includes depositing an amorphous semiconductor material.

18. The method of claim 13, wherein the insulator material includes a flowable oxide material.

19. The method of claim 13, wherein the first cap layer includes a nitride material.

* * * * *